(12) United States Patent
Renaud (10) Patent No.: US 10,090,635 B2
(45) Date of Patent: Oct. 2, 2018

(54) LIGHT MODULE COMPRISING A LASER ELEMENT

(71) Applicant: VALEO VISION, Bobigny (FR)

(72) Inventor: Pierre Renaud, Bobigny (FR)

(73) Assignee: VALEO VISION, Bobigny (FR)

( * ) Notice: Subject to any disclaimer, the term of this patent is extended or adjusted under 35 U.S.C. 154(b) by 4 days.

(21) Appl. No.: 15/586,883

(22) Filed: May 4, 2017

(65) Prior Publication Data
US 2017/0324214 A1 Nov. 9, 2017

(30) Foreign Application Priority Data

May 4, 2016 (FR) ..................... 16 54056

(51) Int. Cl.
*H01S 5/00* (2006.01)
*B60Q 1/04* (2006.01)
*G02B 6/42* (2006.01)
*G02B 27/09* (2006.01)
*H01S 5/022* (2006.01)
*H01S 5/20* (2006.01)
(Continued)

(52) U.S. Cl.
CPC .......... *H01S 5/0071* (2013.01); *B60Q 1/0023* (2013.01); *B60Q 1/0408* (2013.01); *F21S 41/14* (2018.01); *F21S 41/16* (2018.01); *F21S 41/338* (2018.01); *F21V 23/0457* (2013.01); *G02B 6/42* (2013.01); *G02B 27/095* (2013.01); *H01S 5/02248* (2013.01); *H01S 5/2059* (2013.01); *F21Y 2115/30* (2016.08)

(58) Field of Classification Search
CPC .. H01S 5/0071; H01S 5/02248; H01S 5/2059; B60Q 1/0408; B60Q 1/0023; G02B 6/42; G02B 27/095; F21S 41/16; F21S 41/338; F21S 41/14; F21V 23/0457; F21Y 2115/30
See application file for complete search history.

(56) References Cited

U.S. PATENT DOCUMENTS

| 6,975,465 B1* | 12/2005 | Chung ............... G02B 27/0972 |
| | | 359/638 |
| 7,400,664 B1* | 7/2008 | Hattori ................. H01S 5/0683 |
| | | 372/50.12 |
| 2001/0008538 A1* | 7/2001 | Nakano .................. G11B 7/123 |
| | | 372/43.01 |

FOREIGN PATENT DOCUMENTS

| DE | 10 2012 220 481 A1 | 5/2014 |
| DE | 10 2014 205 606 A1 | 10/2015 |
| EP | 2 784 382 A2 | 10/2014 |

OTHER PUBLICATIONS

French Preliminary Search Report dated Aug. 26, 2016 in French Application 16 54056 filed on May 4, 2016 (with English Translation of Categories of Cited Documents).

* cited by examiner

*Primary Examiner* — Xinning Niu
(74) *Attorney, Agent, or Firm* — Oblon, McClelland, Maier & Neustadt, L.L.P.

(57) ABSTRACT

The invention relates to a light module including a semiconductor laser element emitting a laser beam in a first cone of light, a photoluminescent element, and an optical means for transforming the light coming from the photoluminescent element into an exit light beam. The optical means has a guiding portion arranged to guide at least a portion of the light emitted in the first cone of light into a second cone of light and a device for detection of incident light. The light module comprises a means of deviation designed to deviate

(Continued)

the light of the second cone of light toward a third cone of light directed toward the detection device arranged outside of the second cone of light.

20 Claims, 5 Drawing Sheets

(51) Int. Cl.
*B60Q 1/00* (2006.01)
*F21V 23/04* (2006.01)
*F21S 41/14* (2018.01)
*F21S 41/33* (2018.01)
*F21S 41/16* (2018.01)
*F21Y 115/30* (2016.01)

LIGHT MODULE COMPRISING A LASER ELEMENT

TECHNICAL FIELD OF THE INVENTION

The invention concerns a light module designed to emit a light beam comprising a semiconductor laser element.

More particularly, the invention concerns a light module, especially for a motor vehicle, designed to emit an exit light beam and comprising:
- at least one semiconductor laser element designed to emit a laser beam in a first cone of light;
- a photoluminescent element designed to convert at least a portion of said laser beam;
- an optical means for transforming the light coming from the photoluminescent element into said exit light beam oriented in a direction of emission, the optical means comprising a guiding portion arranged to guide at least a portion of the light emitted in said first cone of light into a second cone of light;
- at least one device for detection of incident light greater than a predetermined threshold of luminous intensity.

TECHNICAL BACKGROUND OF THE INVENTION

Semiconductor laser elements have very advantageous properties, for example, a much reduced surface of light emission, a very intense and very collimated laser beam. Thus, optical systems for laser light can be designed with much shorter focal distances than for systems using less collimated light sources, such as incandescent lamps and light-emitting diodes (LEDs). Thus, the optical systems for laser light have a particularly reduced overall size.

The laser sources used in an automobile generally comprise a semiconductor laser element able to emit an overall monochromatic laser beam of given wavelength and a photoluminescent element able to convert a portion of the monochromatic laser beam into a light beam having a broader wavelength spectrum than that of the laser beam.

However, the use of a semiconductor laser element as such a light source for the light modules of motor vehicles poses certain problems due in particular to the fact that such a light source emits a substantially monochromatic coherent light beam when the photoluminescent element is deteriorated or when it is shifted outside of the path of the laser source. Thus, the type of laser used for lighting or signaling applications on board a motor vehicle emits a laser beam which is liable to pose certain problems of safety in the event of malfunctioning of the photoluminescent element. Such a laser beam is particularly harmful to the eyes of an observer, or at the very least risks blinding a user of the road.

Furthermore, the lighting or signaling functions of motor vehicles require light beams having light with a more extensive spectrum than that of a laser beam, for example, a white light.

In order to solve the problems of safety while transforming the laser beam into luminous radiation adapted for the lighting or signaling functions, it is known to interpose a photoluminescent element in the path of the laser beam. Such a photoluminescent element comprises a photoluminescent substance which is excited by light whose wavelength range includes that of the laser beam, for example blue. Consequently, the photoluminescent element emits light whose wavelength spectrum extends into a wavelength range excluding that of the laser beam, or off-centre with respect to that of the laser beam, for example yellow. Thus, at least a part of the incident light of a given wavelength is converted into light of other wavelengths which emits in all directions.

Moreover, at least another part of the incident light is dispersed by the photoluminescent element. In this way, the dispersed light and the converted light are additively superimposed, for example to form a white light.

For the reasons of safety mentioned above, the photoluminescent element thus takes on particular importance. If the photoluminescent element were to be damaged or removed from the path of the laser beam, for example due to an impact, the concentrated laser beam not converted is liable to be emitted by the light module in the direction initially provided for the exit light beam. In these cases, safety measures need to be considered in order to prevent endangering the users of the road.

One solution contemplated is to place a device for detection of the wavelength of the laser in the path of the laser beam downstream from the photoluminescent element. Thus, when the photoluminescent element is no longer performing its function, the laser beam touches the detection device directly. If such is the case, the power supply of the laser element is interrupted by a means of control of the laser element, such as an electronic control unit.

However, such devices are generally bulky.

Moreover, such devices require a precise arrangement of the detection device. This requires, in particular, a very slight positioning tolerance for the means of guiding the light in relation to the optical means.

BRIEF SUMMARY OF THE INVENTION

The present invention proposes a light module of the type described above, characterized in that the detection device is arranged outside of the second cone of light and in that the light module comprises a means of deviation arranged across the second cone of light in order to deviate the incident light into a third cone of light directed toward the detection device.

The exit light beam is oriented toward the outside of the vehicle, for example, toward the front, in order to realize a lighting or signaling function.

Advantageously, the third cone is oriented along a direction different from the direction of orientation of the second cone and/or has an aperture angle greater than that of the second cone.

According to other characteristics of the invention:
- the means of deviation comprises at least one optical element through which the light passes and which comprises an entrance face for the light of the second cone of light and an exit face for the light in the third cone of light;
- the optical element deviates the light by refraction;
- the optical element is formed by a prism;
- the optical element is formed by a lens;
- the means of deviation comprises means of spreading the light so that the third cone of light has an aperture angle greater than that of the second cone of light;
- at least one of the faces among the entrance face and the exit face of the optical element is structured to spread the light;
- at least one of the faces among the entrance face and the exit face of the optical element has a surface state diffusing the light; the means of deviation being for example a plate made of a transparent or translucent material and at least one of its entrance or exit faces, or both of them, is grainy, the optical element is made of a light diffusing material;
the light module comprises at least two detection devices, each of them arranged in the third cone of light;
each detection device is arranged outside of the second cone of light;
the optical means comprises a reflection surface of which a principal portion reflects light coming from the photoluminescent element to form said exit light beam;
the guiding portion is formed by a secondary portion of the reflection surface which reflects the light coming from the first cone of light into the second cone of light;
the guiding portion is formed by an orifice which passes through a secondary portion of the reflection surface;
the detection device comprises a photodiode;
the detection device and the laser element are carried by a common support, especially by a common electronic card;
the light module comprises a means of control of the laser element which is designed to interrupt the emission of the laser beam when the detection device detects an intensity greater than the predetermined threshold;
the guiding portion of the optical means guides at least a portion of the light emitted in said first cone of light into a second cone of light oriented in a second determined direction which is different from the first direction of emission of the exit light beam;
the means of deviation is formed by at least one optical element separate from the element carrying the guiding portion;
the guiding portion is carried in fixed manner by the optical means.

BRIEF DESCRIPTION OF THE FIGURES

Other characteristics and advantages of the invention will appear in the course of the perusal of the following detailed description for the understanding of which reference shall be made to the appended drawings, in which.

DETAILED DESCRIPTION OF THE FIGURES

In the following description, elements having an identical structure or analogous functions shall be denoted by the same references.

In the description and the claims, the term "cone of light" applies to the envelope of a light beam. Such a cone of light is not limited only to cones of revolution. Thus, one will understand that a cone of light may have various cross sectional shapes, such as round, oval, rectangular, etc.

Figure 1:
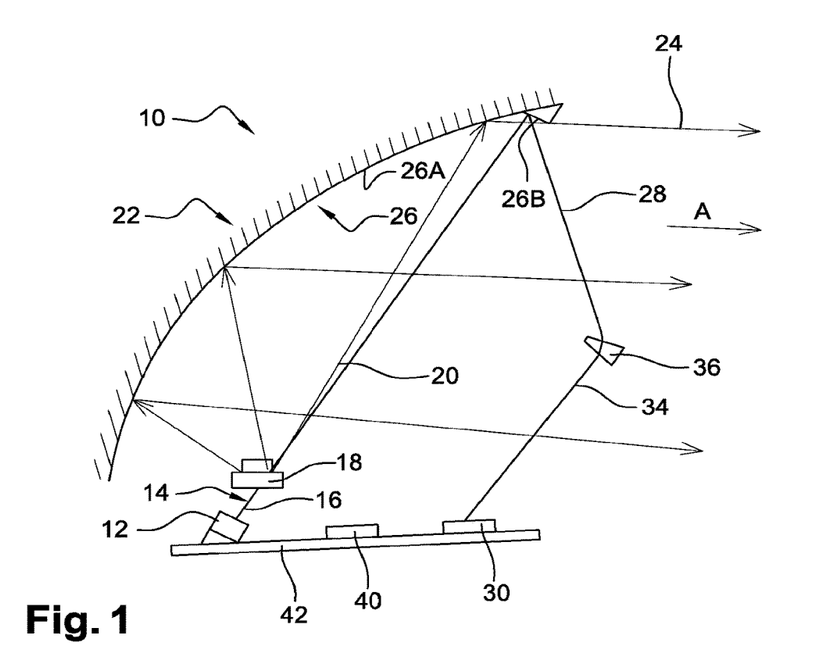
FIG. 1 is a schematic view in axial section representing a light module with a laser element realized according to a first embodiment of the invention, the light module emitting an exit light beam.

There is shown in FIG. 1 a light module 10 comprising a semiconductor laser element 12. The laser element 12 is configured to emit a laser beam 14 whose envelope is bounded by a first cone of light 16, known as the emission cone 16, with very slight aperture angle focused around an overall direction of emission. In this regard, the laser beam 14 in the drawings will be shown by a single line. For example, this is a laser beam 14 of blue color.

When the light module 10 is operating normally, as illustrated in FIG. 1, the laser beam 14 is intercepted by a photoluminescent element 18 which is situated in the path of the laser beam 14. The photoluminescent element 18 is designed to convert the wavelength of at least a portion of said laser beam 14 into incoherent light with a wavelength different from that of the laser beam 14.

Moreover, the photoluminescent element 18 is designed to disperse the light passing through it.

For example, this is an optical element comprising a luminophore.

Under the action of the laser beam 14, the photoluminescent element 18 emits light distributed in a secondary light beam 20 with very broad aperture angle as compared to that of the laser beam 14. The light emitted in the secondary light beam 20 is preferably incoherent, polychromatic or white. Its luminous intensity is reduced as compared to that of the laser beam 14. Thus, this light presents no danger to the users of the road.

The light module 10 also comprises an optical means 22 for transforming the light coming from the photoluminescent element 18 into an exit light beam 24 oriented in a direction of emission "A". This exit light beam 24 is oriented toward the outside of the vehicle, for example, toward the front, in order to realize a lighting or signaling function.

In the example represented in FIG. 1, the optical means 22 has a reflection surface 26 of which a principal portion 26A is substantially parabolic. The principal portion 26A of the reflection surface 26 is designed to transform, by reflection, the secondary beam 20 into an exit beam 24 collimated in the direction of emission "A". For this purpose, the photoluminescent element 18 is arranged substantially at a focus of the principal portion 26A of the reflection surface 26.

When the photoluminescent element 18 is no longer able to perform its function, the laser beam 14 passing near the focus of the principal portion 26A of the reflection surface 26 is liable to be routed by the latter in the direction of emission "A".

To prevent such a situation, the optical means 22 comprises a guiding portion which is arranged to guide at least a portion of the light emitted in said emission cone 16 in order to form an extracted light beam which is bounded by a second cone of light 28 oriented in a determined direction of extraction "B", termed hereafter the "extraction cone 28".

The guiding portion is carried in fixed manner by the optical means.

Figure 2:
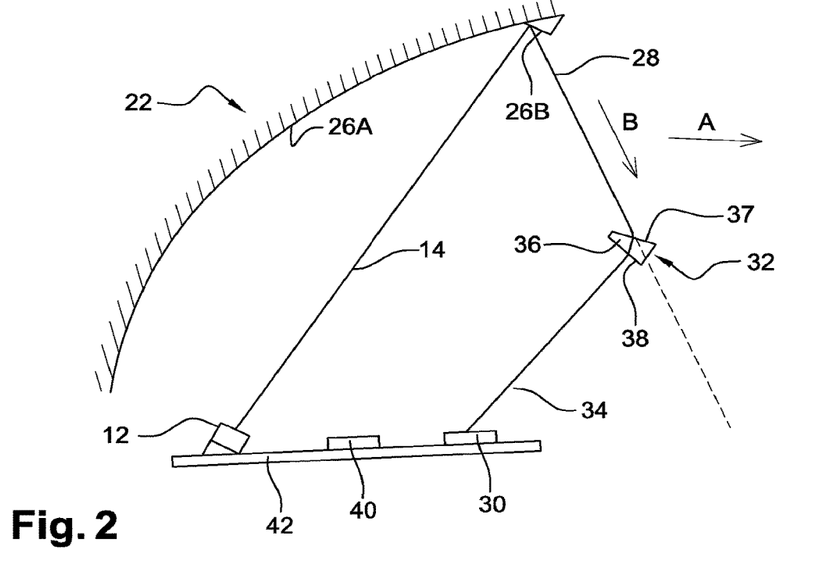
FIG. 2 is a view similar to that of FIG. 1 representing the light module of FIG. 1 in a case of malfunctioning, the laser beam being guided and then deviated toward a detection device.

According to the first embodiment represented in FIG. 2, the guiding portion is formed by a secondary portion 26B of the reflection surface 26 which reflects the light coming from the emission cone 16 into the extraction cone 28. The secondary portion 26B having a substantially smooth surface state, the aperture angle of the extraction cone 28 remains substantially unchanged in relation to that of the emission cone 16. For this reason, the laser beam 14 reflected in the direction of extraction "B" is also represented by a line in FIG. 2.

Said second determined direction of extraction "B" is different from the first direction of emission "A" of the exit light beam 24. For this purpose, the secondary guiding portion 26B is formed by a substantially planar face forming a rough area in the principal portion 26A of the reflection surface 26.

Advantageously, the guiding portion 26B is arranged at one downstream end of the reflection surface 26 in the direction of projection of the exit light beam 24, so as not to encroach on the effective surface of the reflection surface 26.

Moreover, the light module 10 is also outfitted with at least one device 30 for detection of incident light above a predetermined threshold of luminous intensity, known as the "safety threshold" hereafter. For this purpose, the detection device 30 has a light-sensitive surface. The detection device 30 is designed to detect a variation in the intensity of the light radiation beyond said safety threshold. This safety threshold is determined to guarantee that the luminous radiation is not dangerous to the safety of the users of the road.

In a variant, the detection device is designed to measure in absolute manner the luminous intensity of the luminous radiation detected.

The detection device 30 is designed so as to detect the light which is deviated into the extraction cone 28. Nevertheless, in order to provide freedom in the arrangement of the detection device 30, for example to make it possible to obtain a more compact and easily adjusted light module 10, it is advantageous to be able to deviate precisely the extracted light to the detection device 30.

For this purpose, the detection device 30 is arranged outside of the extraction cone 28. The light module 10 comprises a means 32 of deviation arranged across the extraction cone 28 in order to deviate the incident light into a measurement beam bounded by a third cone of light 34, called the measurement cone 34, directed toward the sensitive surface of the detection device 30.

The means 32 of deviation comprises at least one optical element 36 through which the light passes and which comprises an entrance face 37 for rays of light comprised within the extraction cone 28 and an exit face 38 for the light distributed in the measurement cone 34.

The means 32 of deviation is formed by at least one element separate from the optical means 22.

In this first embodiment, the means 32 of deviation comprises a single optical element 36.

In a variant of this embodiment, not shown, the means of deviation comprises several optical elements.

The optical element 36 deviates the light by refraction. The optical element 36 here is formed by a prism.

In a variant of the invention, not shown, the optical element is formed by a lens.

Given that, after refraction, the aperture angle of the measurement cone 34 remains substantially unchanged with respect to that of the extraction cone 28, the third cone of light 34 has been represented by a solid line in FIG. 2. Shown by broken lines is the extraction cone 28 in which the rays of light would continue their path in the absence of the means 32 of deviation. One notices that the sensitive surface of the detection device 30 is arranged outside of the extraction cone 28.

The light module 10 furthermore comprises a control means 40, for example, an electronic control unit, which is able to order the deactivation of the laser element 12, for example by cutting off the electrical power supply of the laser element 12.

The monitoring of the luminous intensity of the rays of light contained within the measurement cone 34 makes it possible to make sure that the photoluminescent element 18 is properly performing its role.

When the light module 10 is functioning normally, as illustrated in FIG. 1, the light coming from the laser beam 14 has been converted and dispersed by the photoluminescent element 18 before being emitted toward the reflection surface 26 to form the exit light beam 24. The guiding portion 26B extracts some of the rays of light, which thus have the same properties as the rays of light forming the exit light beam 24. These extracted rays of light are then deviated by the means 32 of deviation into the measurement cone 34 in a direction of propagation oriented toward the sensitive surface of the detection device 30. Thus, the light incident on the detection device 30 has a moderated luminous intensity which is less than the safety threshold, guaranteeing a safe use of the light module 10.

On the other hand, the control means 40 is designed to deactivate the laser element 12 when the luminous intensity of the rays of light contained in the measurement cone 34 exceeds the safety threshold.

FIG. 2 shows the light module 10 when the photoluminescent element 18 is no longer performing its function. For example, the photoluminescent element 18 has been dislodged from its location by an impact, and so it is no longer situated in the path of the laser beam 14. In the absence of the photoluminescent element 18, the laser beam 14 with potentially dangerous luminous intensity will directly strike the guiding portion 26B which is arranged in the emission cone 16.

At least part of the laser beam 14 is reflected into the extraction cone 28. The light guided into the extraction cone 28 is then deviated by the optical element 36 into the measurement cone 34 in a direction of propagation oriented directly toward the sensitive surface of the detection device 30. The rays of light reaching the sensitive surface of the detection device 30 then have a luminous intensity which has substantially not been attenuated in regard to the exit of the laser beam 14. Thus, the luminous intensity of the rays of light deviated by the optical element 36 toward the detection device 30 exceeds the safety threshold.

The crossing of the safety threshold is communicated by the detection device 30 to the control means 40. In response, the control means 40 deactivates the laser element 12. In this way, the control means 40 interrupts the production of the laser beam 14, preventing any harmful luminous radiation from leaving the light module 10.

As represented in FIGS. 1 and 2, the laser element 12 and the photodiode forming here the detection device 30 are carried by a common support 42. The common support 42 ensures both the mechanical fixation and the electrical connection of the laser element 12 and the detection device 30. The common support 42 is formed here by a common electronic card.

The means 32 of deviation advantageously allows a shifting of the detection device 30 in the direction of the laser element 12 on the common support 42 in relation to the extraction cone 28. This makes it possible to have a more compact support 42.

Furthermore, the position of the optical element 36 forming the means 32 of deviation is able to be adjusted independently of the position of the guiding portion 26B. This makes it possible to adjust precisely the direction of propagation of the measurement cone 34 toward the sensitive surface of the detection device 30, independently of the positioning tolerances of the light guiding means.

Figure 3:
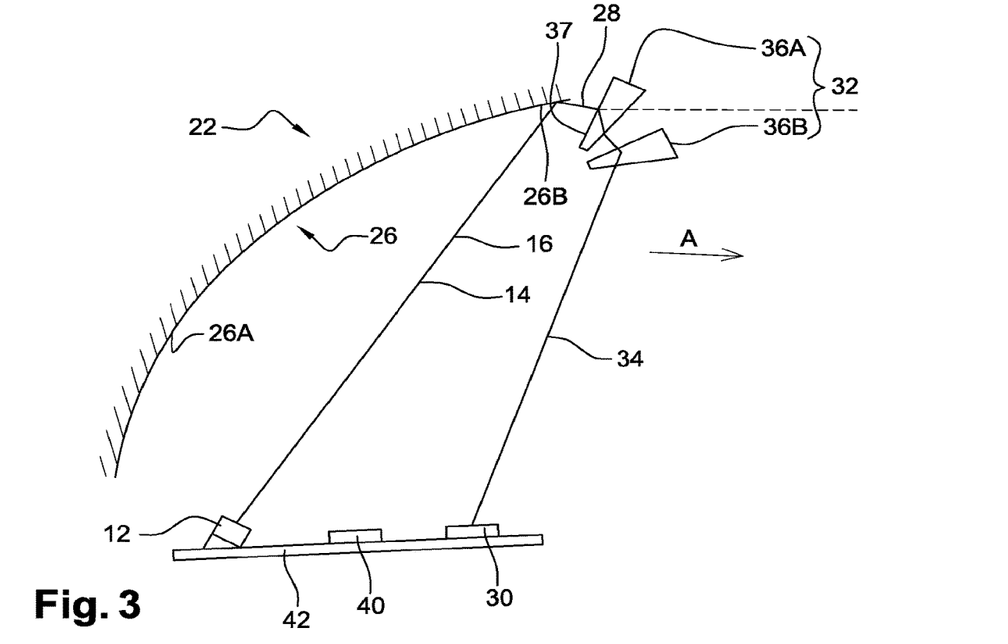
FIG. 3 is a view similar to that of FIG. 2 representing a second embodiment of the invention in which the means of deviation of the light beam comprises two optical elements.

A second embodiment of the invention has been shown in FIG. 3. This second embodiment has many similarities with the first embodiment. Only the differences shall be detailed in the following.

In the light module 10 produced according to this second embodiment, the guiding portion 26B sends the rays of light coming from the emission cone 16 in the same general direction as the exit light beam 24. In this regard, the guiding portion 26B is formed by a portion of the reflection surface 26 which completes the principal portion 26B of the reflection surface 26. Thus, the extraction cone 28 is oriented overall in the direction of emission "A" of the exit light beam 24.

To allow a deviating of the rays of light of the extraction cone 28 in the direction of the detection device 30, the means 32 of deviation comprises here a first upstream optical element 36A and a second downstream optical element 36B. The optical elements both deviate the light by refraction, for example, they are prisms.

The upstream optical element 36A is arranged across the extraction cone 28 in order to thus first deviate the rays of light entering by its entrance face 37 toward the downstream optical element 36B. The downstream optical element 36B then deviates these rays of light which have been deviated by the upstream optical element 36A into the measurement cone 34 in a direction of propagation oriented directly toward the detection device 30.

The series of optical elements 36A, 36B forming the means 32 of deviation thus makes it possible to deviate the rays of light coming from the extraction cone 28 by a very large angle. The geometry of the reflection surface 26 is thus simplified with respect to that of the first embodiment while keeping a very compact common support 42 for the laser element 12 and the detection device 30.

Moreover, at least one of the optical elements 36A, 36B is an element separate from the optical means 22 to allow an adjustment of the direction of propagation of the measurement cone 34 independently of the positioning tolerances of the guiding portion 26B.

Figure 4:
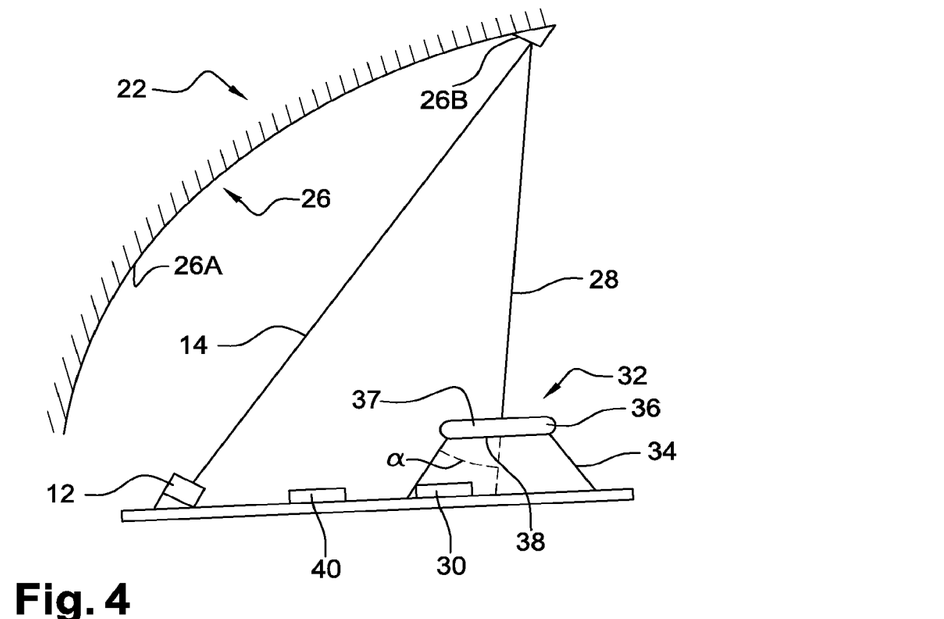
FIG. 4 is a view similar to that of FIG. 3 representing a third embodiment of the invention in which the means of deviation comprises an optical element which spreads the light.

A third embodiment of the invention is represented in FIG. 4. This embodiment is similar to that which has been described for the first embodiment. Only the differences shall be described in the following.

In this third embodiment, the means 32 of deviation comprises means of spreading the light so that the measurement cone 34 has an aperture angle greater than that of the second extraction cone 28. Thus, the measurement light beam is very divergent with respect to the extracted beam.

In the example embodiment shown in FIG. 4, the measurement cone 34 is directed substantially in the same direction as the extraction cone 28. Even so, some of the rays of light coming from the extraction cone 28 are deviated toward the outside of the extraction cone 28 due to the greater aperture angle of the measurement cone 34.

The means 32 of deviation here comprises a single optical element 36 designed for the light to pass through. At least one of the faces among the entrance face 37 and the exit face 38 of the optical element 36 is structured to spread the exit light in the measurement cone 34.

Figure 5:
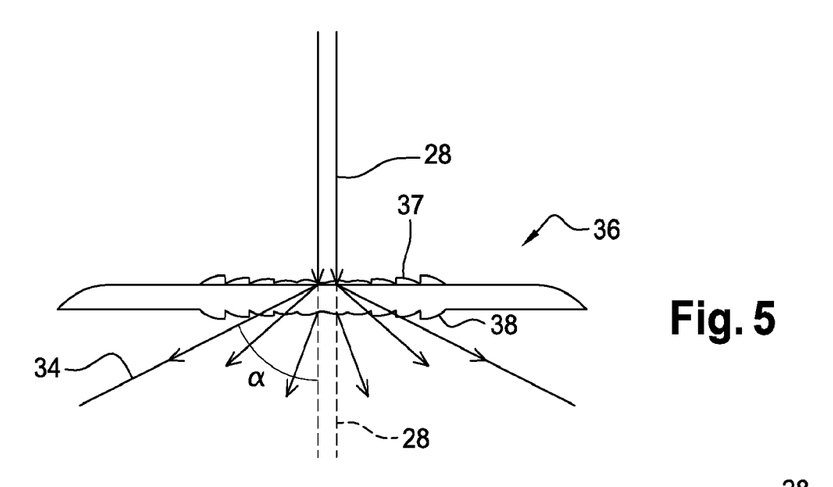
FIG. 5 is a detail view representing the optical element of FIG. 1 outfitted with faces structured to spread the light.

The optical element 36 has been shown in further detail in FIG. 5. The entrance face 37 and the exit face 38 of the optical element 36 are both structured to spread the exit light in the measurement cone 34 by refraction. Each face 37, 38 thus has striations making it possible to spread the light at least in a plane with an aperture angle $\alpha$ which is substantially greater than the nearly zero aperture angle of the extraction cone 28. Thus, at an equal distance downstream from the optical element 36, the surface illuminated by the measurement cone 34 is much greater than the surface illuminated by the extraction cone 28 at the level of the support 42 of the detection device 30.

As shown in FIG. 4, the detection device 30 is shifted to the outside of the extraction cone 28, at the periphery and inside of the measurement cone 34. Thus, the detection device 30 is exposed solely to the rays of light deviated by the means 32 of deviation and not to the rays of light continuing their path in the extraction cone 28.

Such an embodiment advantageously enables a homogenization of the light incident on the detection device 30.

Moreover, the measurement cone 34 has a sufficient aperture angle to illuminate the entire sensitive surface of the detection device 30. This enables a tremendous simplification of the adjusting of the saturation of the detection device 30.

Figure 6:
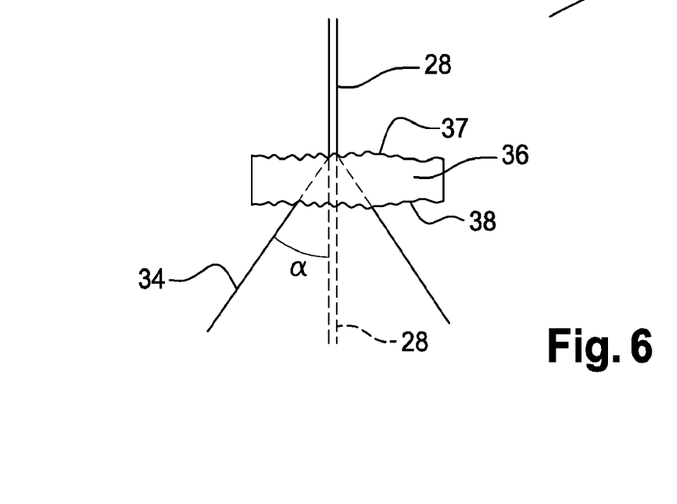
FIG. 6 is a view similar to that of FIG. 5 representing a variant embodiment of the optical element outfitted with faces diffusing the light.

According to one variant of this third embodiment, which is shown in FIG. 6, the optical element 36 of the means 32 of deviation deviates the light by diffusion. In the example shown in FIG. 6, at least one of the faces among the entrance face 37 and the exit face 38 of the optical element has a surface state favoring the diffusion of light. For example, the entrance face 37 and the exit face 38 is grainy.

As a variant, the material making up the optical element 36 favors the diffusion of light.

Figure 7:
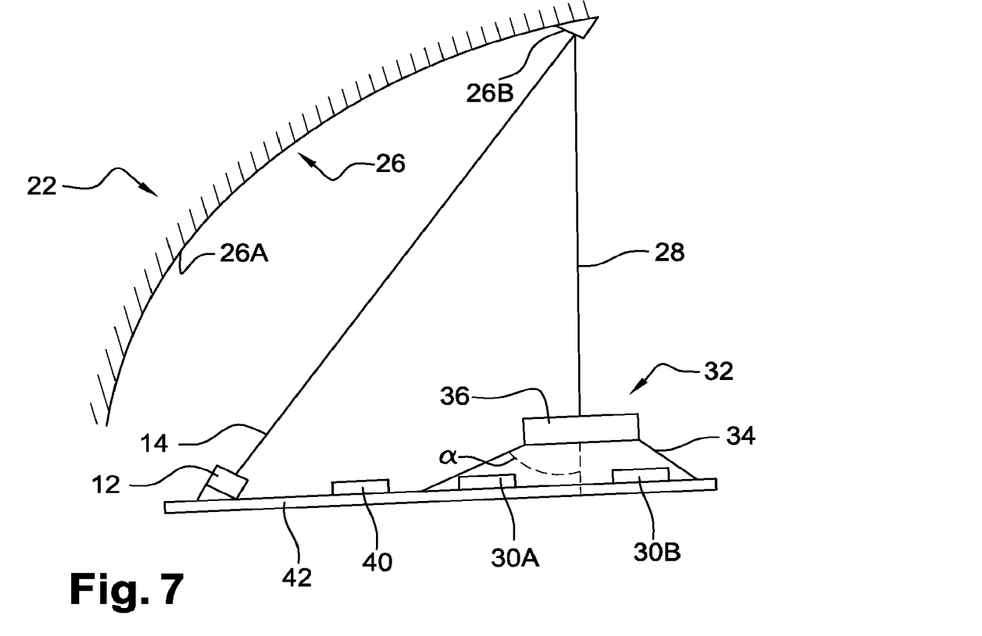
FIG. 7 is a view similar to that of FIG. 4 representing a fourth embodiment of the invention in which the light module comprises two detection devices.

A fourth embodiment of the invention has been shown in FIG. 7. This fourth embodiment of the invention is identical in all points to the third embodiment except for the fact that the light module 10 here comprises a plurality of devices for detection of the luminous intensity. At least one of the detection devices is arranged outside of the extraction cone 28.

In the example shown in FIG. 7, it comprises two detection devices 30A, 30B. Each detection device 30A, 30B is able to communicate with the control means 40 to enable the deactivating of the laser element 12 when a crossing of the safety threshold is detected by one and/or the other of the detection devices 30A, 30B.

Each of these detection devices 30A, 30B is arranged in the measurement cone 34. The two devices 30A, 30B are arranged here outside of the extraction cone 28.

As a variant, only one of the detection devices is arranged outside of the extraction cone.

The two devices 30A, 30B are carried by the common support 42. This makes it possible to have a more compact light module 10.

The presence of the two detection devices 30A, 30B makes possible a redundant detecting of the intensity of the rays of light of the measurement cone 34. It is thus possible to diagnose the malfunctioning of one of the detection devices 30A, 30B when the detection devices 30A, 30B communicate contradictory information to the control means 40.

As explained above, the first two embodiments enable a deviating of the overall direction of propagation of the measurement cone 34, for example by refraction, in relation to that of the extraction cone 28, whereas the third and fourth embodiments make it possible to deviate the rays of light to obtain a measurement cone 34 having an aperture angle greater than that of the extraction cone 28 without modifying its overall direction of propagation.

Figure 8:
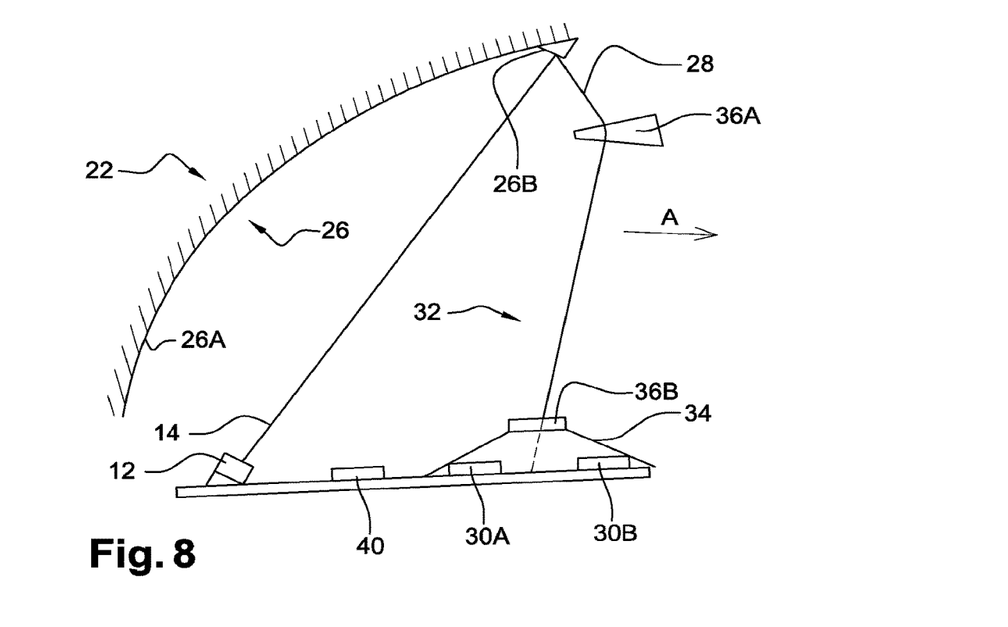
FIG. 8 is a view similar to that of FIG. 7 representing a variant embodiment of the invention in which the means of deviation comprises a first optical element for deviation by refraction and a second optical element for spreading of the light.

Of course, as is represented in FIG. 8, it is possible to combine the different embodiments described above in order to obtain a measurement cone 34 having at the same time a larger aperture angle and an overall direction of propagation different from that of the extraction cone 28.

In the example shown in FIG. 8, the means 32 of deviation comprises an upstream optical element 36A and a downstream optical element 36B.

The upstream optical element 36A here has the function of deviating the overall direction of propagation of the extraction cone 28 by refraction. It is a prism here. An intermediate beam thus emerges from this upstream optical element 36A in the direction of the downstream optical element 36B. This intermediate beam is comprised within an intermediate cone 44 having an overall direction of propagation different from that of the second cone of light 28, but their aperture angles are substantially equivalent.

The downstream optical element 36B has the function here of deviating part of the rays of light of the intermediate cone 44 to spread the light in the measurement cone 34. The measurement cone 34 thus has an overall direction of propagation identical to that of the intermediate cone 44, but a greater aperture angle.

Figure 9:
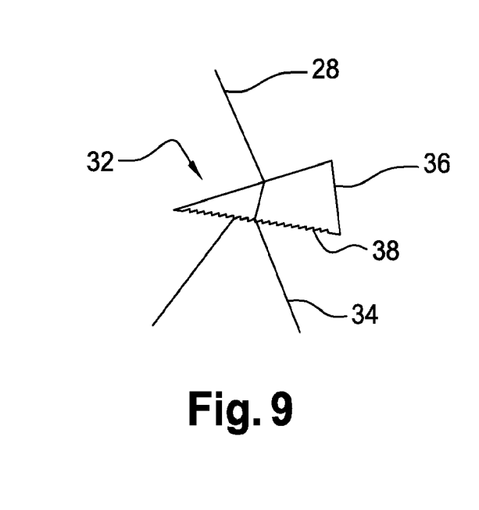
FIG. 9 is a view similar to that of FIG. 6 representing a means of deviation which is outfitted with an optical element able to deviate the overall direction of propagation of the light by refraction and to spread the light.

According to one variant embodiment shown in FIG. 9, the functions of deviation of the overall direction of propagation and widening of the aperture angle of the measurement cone 34 are performed by a single optical element 36. It is a prism here, whose exit face is grainy or structured to spread the light.

Of course, one could contemplate variant embodiments of each of the previously described embodiments.

Figures 10, 11:
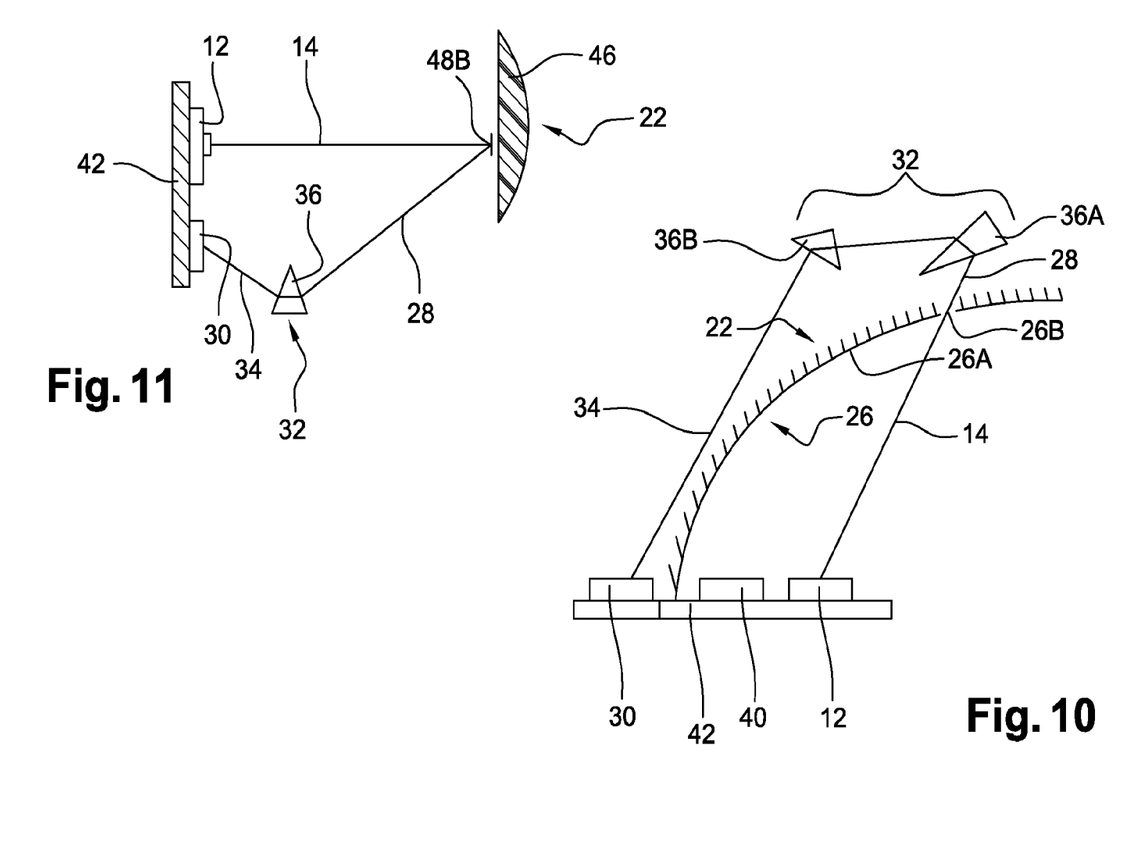
FIG. 10 is an exemplary embodiment in which the guiding portion is formed by an orifice which passes through a secondary portion of reflection surface.
FIG. 11 is an exemplary embedment in which the optical means transforming the light coming from the photoluminescent element into exit light beam comprises a lens.

For example, making reference to FIG. 10, the guiding portion 26B is formed by an orifice which passes through a secondary portion of reflection surface 26. The light beam extracted by this orifice 26B is thus comprised within an extraction cone 28 which is directed toward the means 32 of deviation, being similar here to the one described in the second embodiment, in order to be routed to the detection device 30.

This variant embodiment thus advantageously enables an arranging of the detection device 30 on the same support 42 as the laser element 14.

Of course, such a variant is applicable to any one of the previously described embodiments.

According to another variant embodiment shown in FIG. 11, the optical means 22 transforming the light coming from the photoluminescent element 18 into exit light beam 24 comprises a lens 46. The lens 46 has an incident face 48 which receives the light coming from the photoluminescent element 18.

Said incident face 48 comprises a guiding portion 48B which is formed, for example, by a metallized portion which is able to reflect the incident rays of light of the laser beam 14 to form an extraction cone 28. As in the first embodiment, a means 32 of deviation, here a prism 36, deviates the rays of light of the extraction cone 28 into a measurement cone 34 in the direction of the detection device 30.

Of course, this variant can be combined with any one of the previously described embodiments.

The light module 10 realized according to the teaching of the invention thus makes it possible to provide freedom in the positioning tolerance of the detection device 30 in relation to the guiding portion. In fact, the means of deviation comprises a separate optical element, which is able to be adjusted in position in relation to the guiding portion and in relation to the detection device 30 in order to precisely adjust the direction of propagation of the measurement cone 34.

Moreover, the possibility of obtaining a measurement beam having a broader aperture angle makes it possible to illuminate the entire sensitive surface of the detection device 30, thus facilitating the adjustment of its saturation.

Furthermore, when the aperture angle is designed to be sufficiently broad, it is possible to arrange two detection devices 30 in the same measurement beam. Thus, the light module 10 functions in a much more secure manner.

The invention claimed is:

1. A light module for a motor vehicle, the light module being designed to emit an exit light beam and comprising:
   at least one semiconductor laser element designed to emit a laser beam in a first cone of light;
   a photoluminescent element designed to convert at least a portion of said laser beam;
   an optical means for transforming the light coming from the photoluminescent element into said exit light beam oriented in a direction of emission, the optical means comprising a guiding portion arranged to guide at least a portion of the light emitted in said first cone of light into a second cone of light;
   at least one device for detection of incident light greater than a predetermined threshold of luminous intensity;
   wherein the detection device is arranged outside of the second cone of light and the light module comprises a means of deviation arranged across the second cone of light in order to deviate the incident light into a third cone of light directed toward the detection device.

2. The light module according to claim 1, wherein the means of deviation comprises at least one optical element through which the light passes and which comprises an entrance face for the light of the second cone of light and an exit face for the light in the third cone of light.

3. The light module according to claim 2, wherein the optical element deviates the light by refraction.

4. The light module according to claim 2, wherein the means of deviation comprises means of spreading the light so that the third cone of light has an aperture angle greater than that of the second cone of light.

5. The light module according to claim 4, wherein at least one of the faces among the entrance face and the exit face of the optical element has a surface state diffusing the light.

6. The light module according to claim 5, wherein the light module comprises at least two detection devices, each of them arranged in the third cone of light.

7. The light module according to claim 6, wherein each detection device is arranged outside of the second cone of light.

8. The light module according to claim 1, wherein the optical means comprises a reflection surface of which a principal portion reflects light coming from the photoluminescent element to form said exit light beam.

9. The light module according to claim 8, wherein the guiding portion is formed by a secondary portion of the reflection surface which reflects the light coming from the first cone of light into the second cone of light.

10. The light module according to claim 8, wherein the guiding portion is formed by an orifice which passes through a secondary portion of the reflection surface.

11. The light module according to claim 1, wherein the detection device and the laser element are carried by a common support.

12. The light module according to claim 1, wherein the light module comprises a means of control of the laser element which is designed to interrupt the emission of the laser beam when the detection device detects an intensity greater than the predetermined threshold.

13. The light module according to claim 1, wherein the guiding portion of the optical means guides at least a portion of the light emitted in said first cone of light into a second cone of light oriented in a second determined direction which is different from the first direction of emission of the exit light beam.

14. The light module according to claim 1, wherein the means of deviation is formed by at least one optical element separate from the element carrying the guiding portion.

15. The light module according to claim 1, wherein the guiding portion is carried in fixed manner by the optical means.

16. The light module according to claim 3, wherein the means of deviation comprises means of spreading the light so that the third cone of light has an aperture angle greater than that of the second cone of light.

17. The light module according to claim 4, wherein the light module comprises at least two detection devices, each of which is arranged in the third cone of light.

18. The light module according to claim 1, wherein the photoluminescent element is designed to convert at least the portion of said laser beam such that a luminous intensity of the light coming from the photoluminescent element is lower than a luminous intensity of the laser beam.

19. The light module according to claim 1, wherein the predetermined threshold of the detection device is set such that the laser beam emitted from the laser element exceeds the predetermined threshold when the laser beam does not pass through the photoluminescent element.

20. The light module according to claim 1, wherein the light coming from the photoluminescent element is incoherent, polychromatic or white.

* * * * *